United States Patent [19]

Mizukami et al.

[11] Patent Number: 5,422,858
[45] Date of Patent: Jun. 6, 1995

[54] SEMICONDUCTOR INTEGRATED CIRCUIT

[75] Inventors: Masao Mizukami, Yokohama; Yoichi Sato, Iruma; Takahiko Kozaki, Koganei; Satoshi Shinagawa, Akishima, all of Japan

[73] Assignees: Hitachi, Ltd.; Hitachi ULSI Engineering Corp., both of Tokyo, Japan

[21] Appl. No.: 260,894

[22] Filed: Jun. 16, 1994

[30] Foreign Application Priority Data

Jun. 28, 1993 [JP] Japan .................. 5-182061

[51] Int. Cl.⁶ .............................. G11C 8/00
[52] U.S. Cl. .......................... 365/233; 365/220; 365/239
[58] Field of Search ............ 365/233, 219, 220, 221, 365/230.05, 239, 230.88, 189.04

[56] References Cited

U.S. PATENT DOCUMENTS

| | | | |
|---|---|---|---|
| 4,141,039 | 2/1979 | Yamamoto | 365/233 X |
| 4,945,518 | 7/1990 | Muramatsu et al. | 365/233 |
| 5,046,051 | 9/1991 | Doornhein et al. | 365/221 |
| 5,086,388 | 2/1992 | Matoba et al. | 365/219 X |
| 5,097,447 | 3/1992 | Ogawa et al. | 365/239 X |

FOREIGN PATENT DOCUMENTS 4-087362 6/1992 Japan .

Primary Examiner—Joseph A. Popek
Assistant Examiner—Son Dinh
Attorney, Agent, or Firm—Fay, Sharpe, Beall, Fagan, Minnich & McKee

[57] ABSTRACT

A rate conversion circuit area (8) is provided between a spread gate area (4) which operates in synchronization with a clock signal CLK and a RAM core (7) (macro cell) operating in synchronization with a clock signal (ck) whose frequency is higher than that of the clock signal (CLK). With this arrangement, the single port RAM core is made accessible as a dual port RAM by forming the clock signal (ck) whose frequency is multiplied an optional number of times that of the clock signal (CLK), receiving access data equivalent to a plurality of operating cycles in parallel from the spread gate area during a predetermined unit operating access cycle period in the spread gate area, and serially supplying these to the RAM core 7 during the plurality of operating cycle periods in synchronization with the clock signal (ck).

8 Claims, 6 Drawing Sheets

SEMICONDUCTOR INTEGRATED CIRCUIT

BACKGROUND OF THE INVENTION

The present invention relates to a semiconductor integrated circuit, and more particularly to circuit technology applicable to a custom or customized semiconductor integrated circuit known as, for example, ASIC (Application Specific IC) as what is effective in improving the performance of such a semiconductor integrated circuit.

Japanese Patent Laid-Open No. 87362/1992 discloses a so-called multichip system in which a plurality of semiconductor integrated circuits are packaged on a circuit board. Obviously, not much improvement in a circuit-to-circuit signal transmission rate seems possible because the rate is determined by such physical conditions of the circuit board on which the integrated circuits are packaged as signal wiring resistance and parasitic capacity. However, with the progress of semiconductor integrated circuit technology resulting from the miniaturization of circuit elements, improvement in the operating speed of the semiconductor integrated circuit itself is conceivably possible. Granting that the individual semiconductor integrated circuit itself undergoes technological progress like this, the performance of the whole system is restricted by the signal transmission rate between semiconductor integrated circuits and thus unable to make sufficient improvement.

The present inventor has given elaborate study to the following subject so as to solve the problem of the operating speed gap between circuit blocks which will arise in some semiconductor integrated circuits.

A semiconductor integrated circuit such as what is called ASIC has a spread gate area as a circuit area for materializing the functions required by users. The spread gate area is an area whose function required is actually accomplished according to the form of connecting numerous basic circuits arranged repetitively. In this area, the transistor size is substantially uniformized and a necessary wiring area is provided anywhere beforehand; there is therefore a limit to increasing operating speed on the ground that the degree of integration therein is relatively low. On the other hand, macro cells may be employed in such a semiconductor integrated circuit to increase circuit integration. The macro cell is a circuit block which is predetermined to function as RAM or CPU and whose circuit arrangement or operating speed has been optimized. The macro cell is made with, for example, a functional block of RAM as a unit and mainly designed manually so that its density may be greater than that of any other circuit part such as a spread gate area. The progress of circuit and process technology has made it feasible to increase the operating speed of a circuit part like the macro cell considerably as compared with any other part formed in the spread gate area.

In order to utilize the operating performance of the whole semiconductor integrated circuit containing macro cells together with the spread gate area at its maximum, it is needless to say desirable for high-speed operation to be effected in each area as much as possible. Data corresponding to a plurality of operating cycles commensurate with the operating speed of the macro cell will have to be fed in parallel in accordance with the operating cycle of the spread gate area for the purpose. Moreover, the data corresponding to the plurality of operating cycles thus given in parallel will also have to be fed at the most suitable timing for the macro cell. However, it is still difficult meeting the necessities above only by inserting a multiplexer and a demultiplexer in the interface portion between the spread gate area and the macro cell.

Further, some selective function of the macro cell also allows the operating speed gap between the circuit blocks in the semiconductor integrated circuit to be practically absorbed. When, for example, the specification of reading and writing data in parallel from and to the RAM as the macro cell during one memory access cycle period in the spread gate area is to be satisfied, it may be satisfied by adopting a dual port RAM for the ram in question. At this time, the dual port RAM and the spread gate area may be operated at the same speed to meet the requirements. Since the macro cell is capable of operating at high speed as stated above, the function of the macro cell utilized in such a form is not sufficiently demonstrated. Moreover, the area occupied by the RAM having the plurality of ports tends to increase in size because its peripheral circuit becomes twice as large as that of a single port RAM. In view of making the macro cell capable of demonstrating its high-speed operating capability then, an additional circuit will be required to let the single port RAM macro cell perform read/write operations in time series in accordance with the read/write access cycles generated in parallel from the spread gate area.

SUMMARY OF THE INVENTION

An object of the present invention is to provide a semiconductor integrated circuit capable of causing access designations in parallel from one circuit area and access operations in series from another circuit area which receives the designations from the former to be synchronously effected among a plurality of circuit areas.

Another object of the present invention is to provide a semiconductor integrated circuit capable of thoroughly utilizing the performance of macro cells packaged together with a spread gate area on the same semiconductor substrate.

Still another object of the present invention is to provide a semiconductor integrated circuit in which one port of RAM capable of relatively high-speed operation is accessible as a multiport from a circuit area operating at relatively low speed.

These and other objects and novel features of the present invention will become more apparent by referring to the following description and appended drawings.

A brief description will subsequently be given of the preferred embodiment of the present invention.

A semiconductor integrated circuit according to the present invention comprises a first circuit area such as a spread gate area operating in synchronization with a first clock signal, a second circuit area such as a macro cell capable of operating in synchronization with a clock signal whose frequency is higher than that of the first clock signal, and a rate conversion circuit area for use in the exchange of data between the first and second circuit areas, these circuit areas being arranged on the same semiconductor substrate, the rate conversion circuit further comprising a multiplied clock generator circuit for forming a second clock signal whose frequency is multiplied an optional number of times that of the first clock signal according to the first clock signal, and a parallel-serial conversion circuit for receiving data equivalent to a plurality of operating cycles in parallel from the first circuit area during a predetermined unit operating cycle period in the first circuit area so as to supply to the second circuit area the parallel data serially during the plurality of operating cycle periods in synchronization with the second clock signal.

In consideration of data transmission from the second circuit area to the first circuit area, the rate conversion circuit area is provided with a serial-parallel conversion circuit for serially receiving data, which the second circuit area obtains during the plurality of operating cycle periods in synchronization with the second clock signal, from the second circuit area so as to supply to the first circuit area the serial data in parallel during the predetermined unit operating cycle period defined by the first clock signal. The rate conversion circuit area is further provided with a stretching circuit for receiving data, which the second circuit area has obtained during the operating cycle period in synchronization with the second clock signal, so as to supply the data to the first circuit area over the operating cycle period in synchronization with the second clock signal.

When the macro cell is a RAM core which has a memory array and access ports for writing and reading data to and from the memory array and is coupled to the rate conversion circuit area, the RAM core makes the number of access ports in appearance as viewed from the first circuit area correspond, through the rate conversion circuit, to the second clock signal whose frequency is multiplied an optional number of times that of the first clock signal.

More specifically, the semiconductor integrated circuit according to the present invention comprises a first circuit area such as a spread gate area operating in synchronization with a first clock signal, a second circuit area such as a RAM core which is capable of operating in synchronization with a clock signal whose frequency is higher than that of the first clock signal and has a memory array and access ports for writing and reading data to and from the memory array, and a rate conversion circuit area for use in the exchange of data between the first and second circuit areas, these areas being provided on the same semiconductor substrate, the rate conversion circuit area further comprising a multiplied clock generator circuit for forming a second clock signal whose frequency is multiplied an optional number of times that of the first clock signal and supplying the second clock signal to the second circuit area, and a parallel-serial conversion circuit for receiving a plurality of memory access data equivalent to a plurality of operating cycles in parallel from the first circuit area during a memory access unit operating cycle period in the first circuit area so as to supply to one of the access ports of the second circuit area the parallel data serially during the plurality of memory operating cycle periods synchronizing with the second clock signal.

When the RAM core has access ports for writing and reading data simultaneously to and from the memory array and when most of access operations for the first circuit area to gain access to the Ram core are those of reading and writing data to be performed alternately, the aforesaid rate conversion circuit intended to increase the efficiency of such an access form comprises a multiplied clock generator circuit for receiving an access control signal for allowing the first circuit area to gain access to the second circuit area and the first clock signal from the first circuit area, and forming a second clock signal whose frequency is multiplied an optional number of times that of the first clock signal according to the first clock signal and read/write signals for sequentially designating a read operation synchronizing the second clock signal and the following write operation so as to supply these signals to the second circuit area when the read and write operations are designated in parallel according the access control signal, a parallel-serial conversion circuit for receiving memory access data for writing and reading in parallel from the first circuit area during a memory access unit operating cycle period in the first circuit area so as to supply to one of the access ports of the second circuit area the plurality of parallel data serially during the plurality of memory operating cycle periods in synchronization with the second clock signal, and a stretching circuit for receiving data, which the second circuit area has read from the memory array during a read operation cycle period in synchronization with the second clock signal, so as to supply the data to the first circuit area over the read operation cycle period in synchronization with the second clock signal.

The second circuit area like the macro cell or the RAM core together with the rate conversion circuit area forms an area called a composite macro cell, which is the combination of a macro cell that forms a core such as the RAM core and another one to be loaded with a circuit necessary for rate conversion. There are prepared several kinds of macro cells in the form of a data library and appropriate ones are selected in conformity with the function desired for a semiconductor integrated circuit.

When a macro cell capable of high-speed operation is employed as part of a circuit area in a semiconductor integrated circuit, the rate conversion circuit area effects signal rate conversion within the chip even though the peripheral logic portion such as the spread gate area is unable to operate at high speed. As set forth above, it is therefore possible to use up such a macro cell substantially at marginal high speed. On condition that, when the macro cell is a RAM, its operating speed can be made twice as high as that of, for example, the spread gate area, the same function as what is fulfilled by a pair of RAMs arranged in parallel and operated in an area twice as large as that of one RAM is theoretically considered accomplishable. In other words, a further increase in chip density is feasible

DESCRIPTION OF THE PREFERRED EMBODIMENTS

Figure 1:
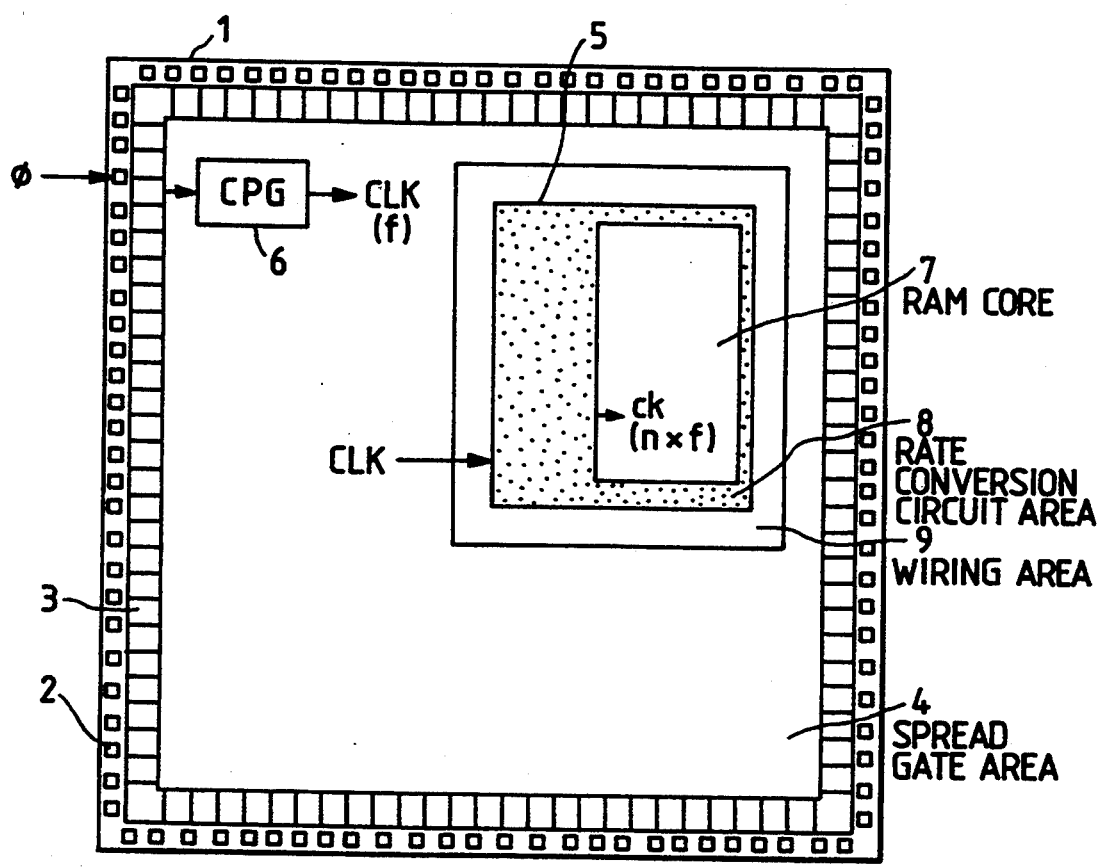
FIG. 1 is a top view of a semiconductor integrated circuit embodying the present invention in the form of a chip image.

FIG. 1 is a top view of a semiconductor integrated circuit embodying the present invention in the form of a chip image.

The gate array technique, for example, is partially adopted to form the aforementioned semiconductor integrated circuit or ASIC with many of bonding pads 2 and input-output buffers 3 arranged on the peripheral portion of a chip 1, its central part including a spread gate area 4 and a composite macro cell 5.

The spread gate area 4 is an area whose function required is actually accomplished according to the form of connecting numerous basic circuits arranged repetitively; namely, it is formed of numerous complementary MOS basic cells of a gate array. Reference numeral 6 denotes a clock pulse generator (CPG) for generating a first clock signal CLK by dividing or simply shaping a system clock signal supplied from the outside, for example. The circuit in the spread gate area 4 is operated in synchronization with the first clock signal CLK. The frequency of the first clock signal CLK according to the present embodiment is defined as f.

The composite macro cell 5 includes a RAM core 7 and a rate conversion circuit area 8 and is made up of macro cells. In other words, each macro cell is so selected as to materialize the function required and these macro cells are combined to form the composite macro cell 5. The density of the circuit element in the macro cell is set greater than that of the spread gate area 4. The macro cell is a functional block whose function is predetermined and the macro cell structure in combination with the core and the peripheral portion makes it feasible to offer a multifunctional composite macro cell. The macro cell function is thus rendered substantial.

The RAM core in the form of a macro cell is predetermined to function as RAM or CPU and whose circuit arrangement or operating speed has been optimized. The macro cell is mainly designed manually so that its density may be greater than that of any other circuit part such as a spread gate area. Consequently, the operating speed of a circuit part of the macro cell can be increased considerably as compared with any other part formed in the spread gate area. The RAM core 7 is capable of operating in synchronization with a clock signal whose frequency is higher than that of the first clock signal CLK.

The rate conversion circuit area 8 forms a second clock signal ck as the synchronizing signal of the RAM core 7 according to the first clock signal CLK. The second clock signal ck has a multiplied frequency which is, for example, n times as high as the frequency of the first clock signal CLK. Further, the rate conversion circuit area 8 makes access data transmission rate conversion so as to cause parallel access designations from the spread gate area 4 and series access operations in the RAM core 7 to be synchronously effected between the spread gate area 4 and the RAM core 7 which are operated in synchronization with clock signals having frequencies different from each other. The rate conversion circuit area 8 and the spread gate area 4 are connected via a wiring area 9 to form a circuit.

The semiconductor integrated circuit is, though not necessarily limited to, a communication control semiconductor integrated circuit and the RAM core 7 is utilized as the main component element of a communication time switch.

Figure 2:
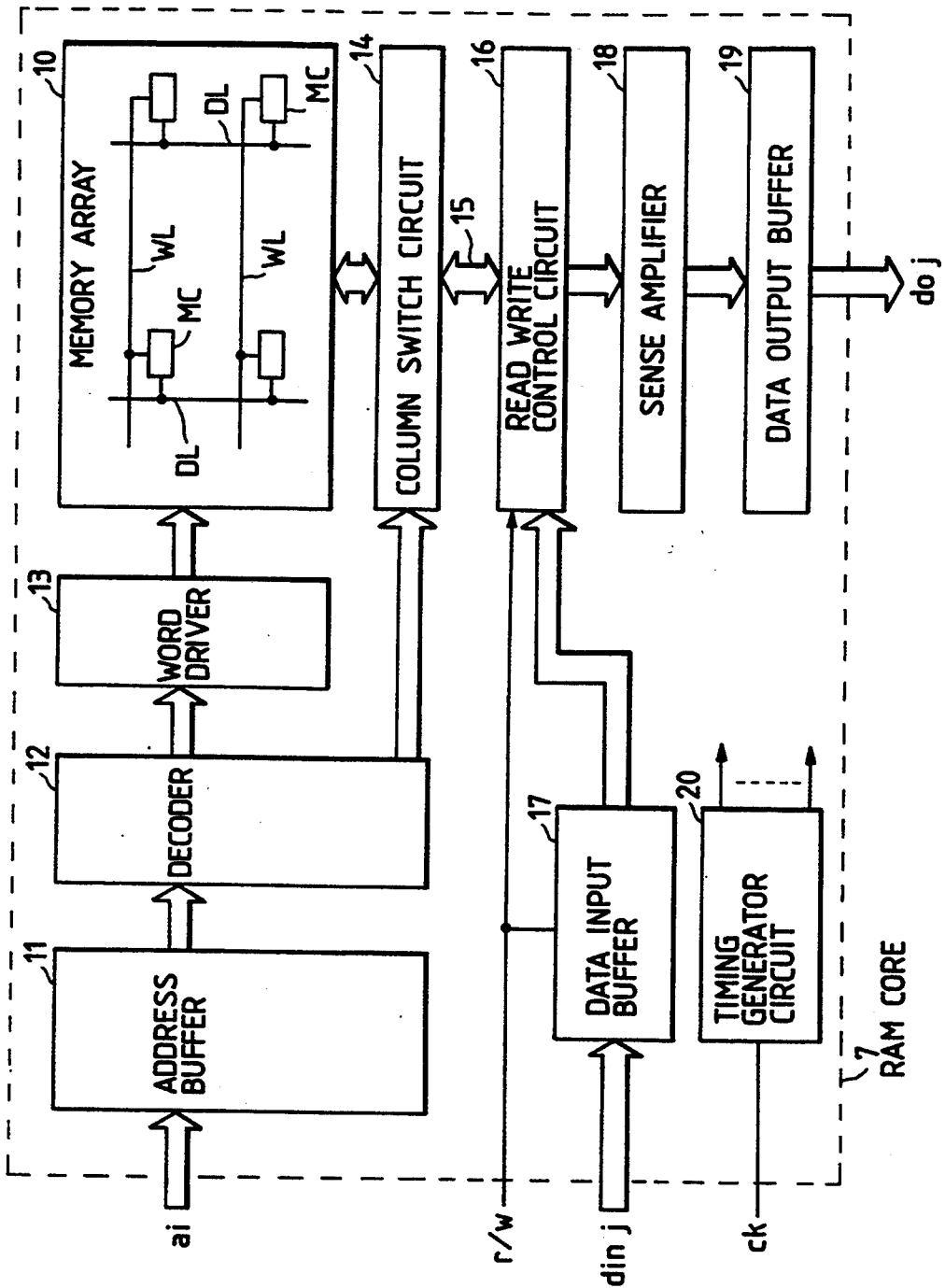
FIG. 2 is an exemplary block diagram of a RAM core.

FIG. 2 is a block diagram of an example of the RAM core. A memory array 10 has read/write enable memory cells MC arranged in the form of a matrix. The selection terminal of the memory cell MC is coupled to a word line WL on the corresponding line, and the data input-output terminal to a data line DL on the corresponding column. An address signal for selecting the memory cell MC is supplied from an address input terminal ai to an address buffer 11 and when the signal is decoded by a decoder 12, a word and a data line selection signal are formed. The word line selection signal is supplied to a word driver 13 and thereby a word line to be selected is driven at the selection level. The data line selection signal is supplied to a column switch circuit 14, whereby a data line to be selected is coupled to a common data line 15. The common data line 15 is coupled to a read/write control circuit 16. The read/write control circuit 16 selects whether to read or write data from or to the memory cell MC coupled to the common data line 15 and this operation is designated according to a read/write signal r/w. Write data from the outside is supplied from a data input terminal dinj to a data input buffer 17 and then to the read/write control circuit 16 at predetermined timing. The data read from the memory cell MC to the common data line 15 is supplied via the read/write control circuit 16 to a sense amplifier 18 at predetermined timing, whereby the read data thus amplified is supplied from the following data output buffer 19 to a data output terminal doj at predetermined timing. Reference numeral 20 denotes a timing generator circuit for the RAM core 7 and is used for generating various operating timing signals in synchronization with the clock signal ck. As is obvious from the above description, the RAM core 7 is a write/read enable single-port RAM which is dynamically operated in synchronization with the clock signal ck.

Figure 3:
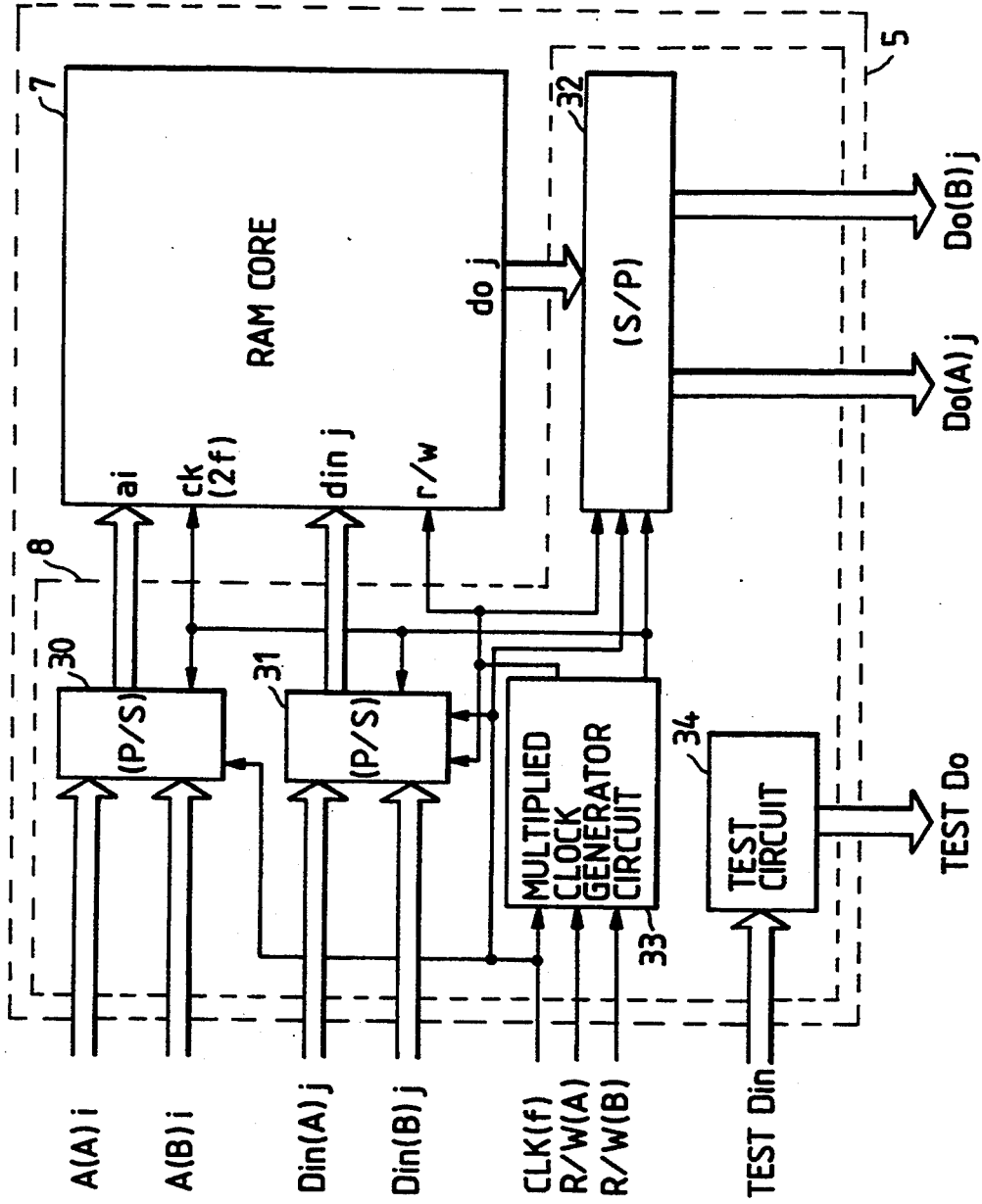
FIG. 3 is a block diagram of a rate conversion circuit area embodying the present invention.

FIG. 3 is a block diagram of a rate conversion circuit area 8 embodying the present invention. The rate conversion circuit area 8 allows the circuit in the spread gate area 4 to gain access to the RAM core 7 as a dual port RAM outwardly. Particularly, the configuration shown in FIG. 3 allows the circuit in the spread gate area 4 to gain parallel write access or parallel read access to the RAM core 7 during a unit operating cycle of memory access. The RAM core 7 thus accessed actually performs serial operations, which are processed at high speed.

The rate conversion circuit area 8 comprises a parallel-serial address conversion circuit 30 for converting two kinds of address signals A(A)i, A(B)i supplied in parallel from the spread gate area 4 to a serial signal and supplying the latter to the address input terminal ai of the RAM core 7, a parallel-serial write data conversion circuit 31 for converting two kinds of write data Din(A)j, Din(B)j supplied in parallel from the spread gate area 4 to serial data and supplying the latter to the data input terminal dinj of the RAM core 7, a serial-parallel read data conversion circuit 32 for converting read data supplied in series from the output terminal doj of the Ram core 7 to parallel data Do(A)j, Do(B)j and outputting the latter, and a multiplied clock generator circuit 33 for forming a second clock signal ck whose frequency (2f) is multiplied, for example, two-fold with respect to the frequency (f) of the first clock signal CLK according to the first clock signal CLK. The output of the parallel-serial write data conversion circuit 31 is so controlled that it is passed into a high impedance state when the read operation is designated according to read/write signals R/W(A), R/W(B). The outputs of the parallel-serial write data conversion circuit 32 are so controlled that they are passed into a high impedance state when the write operation is designated according to read/write signals R/W(A), R/W(B). In FIG. 3, reference numeral 34 denotes the test circuit of the RAM core 7, and reference characters TEST Din, TEST Do respectively represent test data input and output.

The parallel-serial address conversion circuit 30 takes in the address signals A(A)i, A(B)i in parallel in synchronization with the clock signal CLK. When the operating mode indicated by the read/write signals R/W(A), R/W(B) designates the write operation in the memory access cycle on the spread gate area side 4 defined by the cycle of the clock signal CLK, the parallel-serial write data conversion circuit 31 takes in the write data Din(A)j, Din(B)j in parallel in synchronization with the clock signal CLK. The address signals and the write data thus taken in parallel are supplied in series to the RAM core 7 in synchronization with the clock signal ck. In the RAM core 7 where the write operation has been designated according to the read/write signals R/W(A), R/W(B), the A-system write data Din(A)j is written to the memory cell selected according to the A-system address signal A(A)i in the first cycle of the clock signal ck which is subject to two-cycle variation with respect to one cycle of the clock signal CLK, whereas the B-system write data Din(B)j is written to the memory cell selected according to the B-system address signal A(B)i in the next cycle of the clock signal ck. When the operating mode indicated by the read/write signals R/W(A), R/W(B) designates the read operation in the memory access cycle as defined by the cycle of the clock signal CLK, the data read from the memory cell selected according to the A-system address signal A(A)i is supplied from the data output terminal doj of the RAM core 7 to the serial-parallel read data conversion circuit 32 and latched therein in the first cycle of the clock signal ck, whereas the data read from the memory cell selected according to the B-system address signal A(B)i is latched in the serial-parallel read data conversion circuit 32 in the following cycle of the clock signal ck. Both the read data Do(A)j, Do(B)j are read in parallel from the serial-parallel read data conversion circuit 32 at predetermined timing.

The adoption of the rate conversion circuit area 8 shown in FIG. 3 thus allows the circuit in the spread gate area 4 to gain access to the single-port RAM core 7 as a dual port RAM. The parallel access gained by the circuit in the spread gate area 4 is limited to a case of either reading or writing according to the present embodiment. On condition that this utilizing form is satisfactory as long as the semiconductor integrated circuit is totally concerned, however, the area occupied by the RAM is reducible far greater than a case where a RAM core 7 having a dual port is employed. A high access rate is available for the spread gate area 4 likewise.

Figure 4:
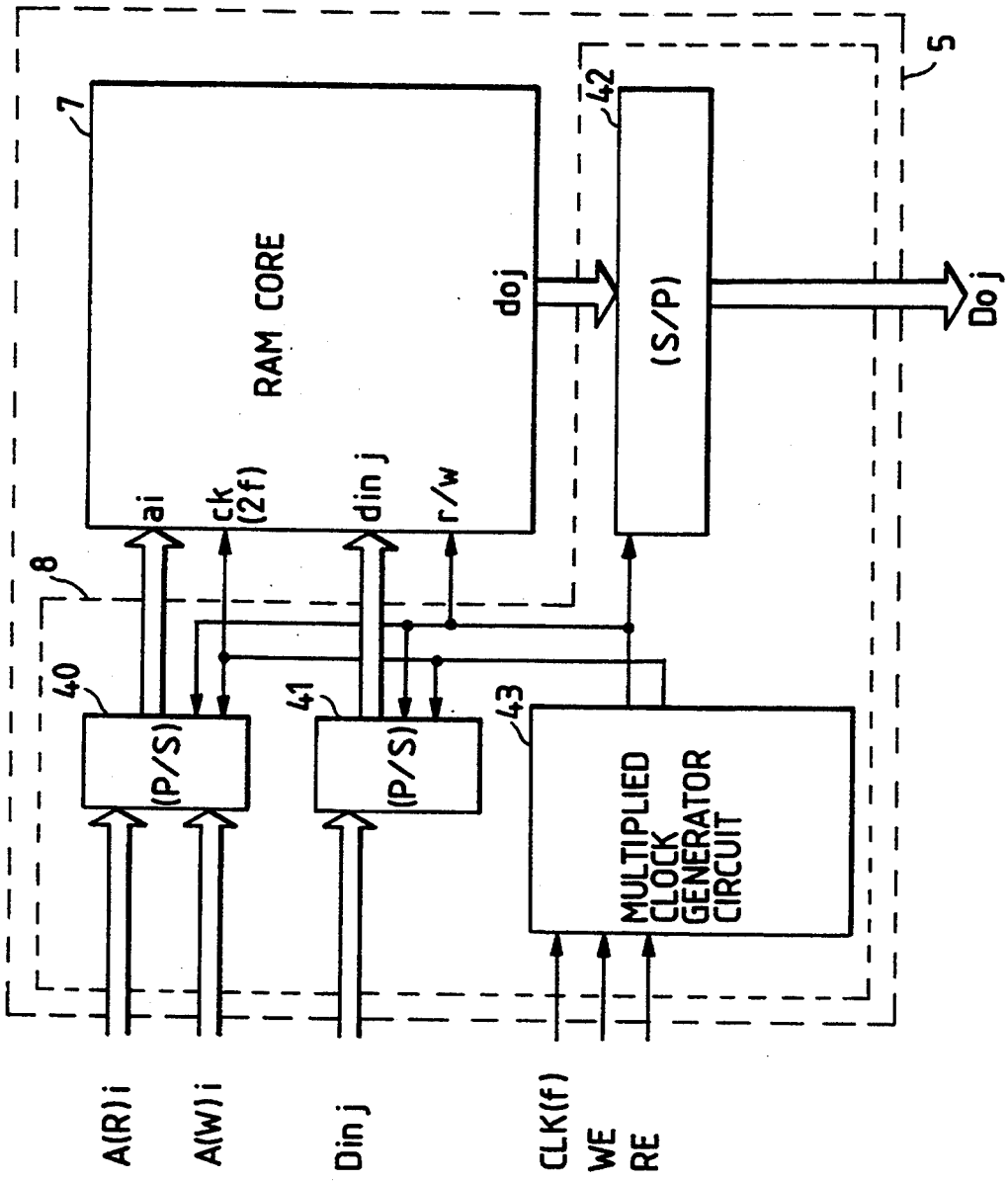
FIG. 4 is a block diagram of another rate conversion circuit area embodying the present invention.

FIG. 4 is a block diagram of another rate conversion circuit area 8 embodying the present invention. As in the case of what is shown in FIG. 3, the circuit in the spread gate area 4 is allowed to gain access to the RAM core 7 as a dual port RAM outwardly. However, the present embodiment differs from the previous one in that read and write operations are paralleled when the spread gate area 4 effects parallel access. In other words, one of the apparent dual ports is set as a special read port, whereas the other one is used for writing purposes.

The rate conversion circuit area 8 of FIG. 4 comprises a parallel-serial address conversion circuit 40 for converting a read address signal A(R)i and a write address signal A(W)i supplied in parallel from the spread gate area 4 to a serial signal and supplying the latter to the address input terminal ai of the RAM core 7, a write data supply circuit 41 for supplying write data Dinj supplied from the spread gate area 4 to the data input terminal dinj of the RAM core 7 at predetermined timing, a stretching circuit 42 for latching the data supplied from the data output terminal doj of the RAM core 7 and stretching the output period of read data Doj for a period desirable for the spread gate area 4, and a multiplied clock generator circuit 43.

The multiplied clock generator circuit 43 is supplied with the first clock signal CLK, a write enable signal WE for designating the write operation and a read enable signal RE for designating the read operation. When the write/read operations are designated in parallel according to the write enable signal WE and the read enable signal RE, the multiplied clock generator circuit 43 forms a second clock signal ck whose frequency (2f) is multiplied, for example, two-fold with respect to the frequency (f) of the first clock signal CLK according to the first clock signal CLK, and further forms a read/write signal r/w for sequentially designating the read operation in synchronization with the second clock signal ck and the write operation which then follows. The read/write signal r/w functions as a switch pulse for switching the read cycle of the RAM core 7 to the write cycle thereof and vice versa, the signal r/w being also supplied to the parallel-serial address conversion circuit 40, the write data supply circuit 41 and the stretching circuit 42.

When the read cycle is designated for the RAM core 7 according to the read/write signal r/w, the parallel-serial address conversion circuit 40 correspondingly reads in the read address A(R)i and otherwise the write address A(W)i when the write cycle is designated therefor. The write data Dinj is given by, though not necessarily limited to, the write data supply circuit 41 to the data input terminal dinj beforehand in response to the read cycle of the RAM core 7. With respect to the data read from the RAM core 7 to the data output terminal doj during this period, its output is maintained over the following write cycle via the stretching circuit 42. The write data Dinj that has been supplied to and held in the RAM core 7 is written to the memory cell in accordance with the address A(W)i in this write cycle.

When either write enable signal WE or read enable signal RE given to, though not necessarily limited to, the multiplied clock generator circuit 43 is kept in an inactive condition, either read or write cycle in the RAM core 7 is nullified. In other words, the RAM core 7 functions as a single port RAM during the cycle operation period of the first clock signal CLK when the parallel read/write access is not designated by the spread gate area 4.

Figure 5:
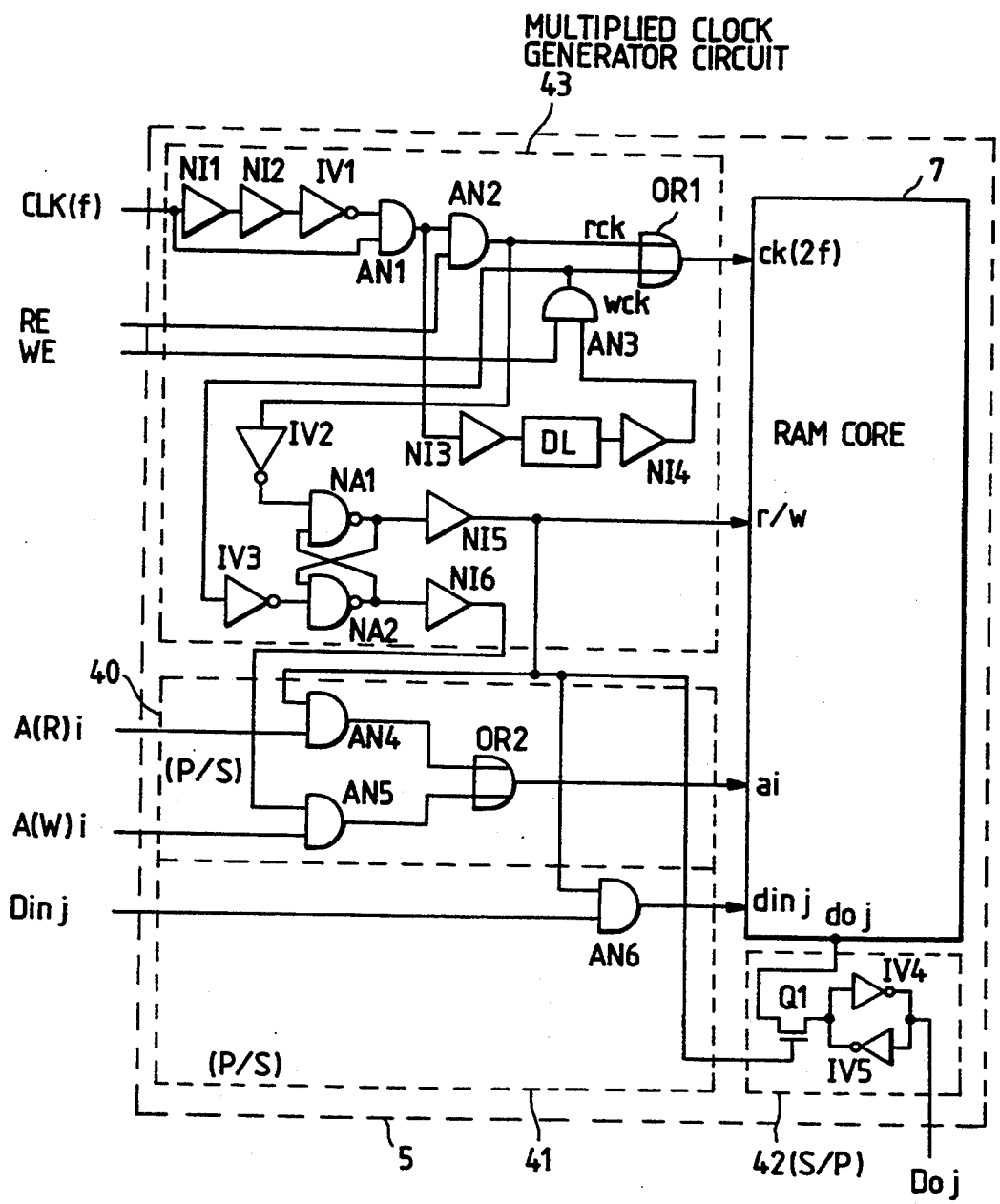
FIG. 5 is an exemplary logic circuit diagram illustrating the details of the rate conversion circuit area of FIG. 4.
Figure 6:
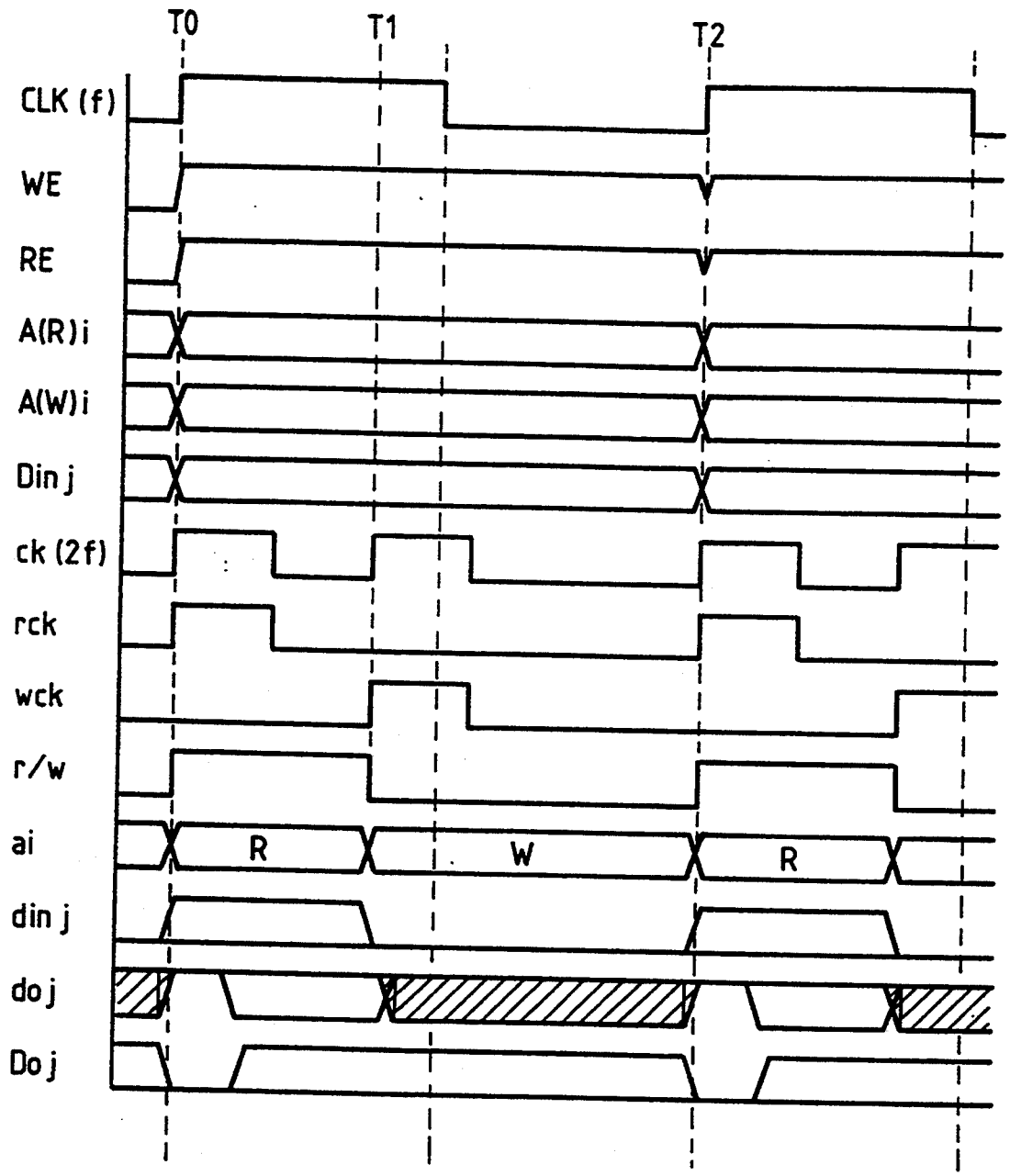
FIG. 6 is an exemplary operating timing chart effective when read/write operations are designated to the logic circuit of FIG. 5 in parallel.

FIG. 5 is an exemplary logic circuit diagram illustrating the details of the rate conversion circuit area of FIG. 4. FIG. 6 is an exemplary operating timing chart.

In the multiplied clock generator circuit 43 of FIG. 5, a delay circuit is formed with a series circuit including two-stage non-invertors (should be considered delay components accompanying no logical inversion or circuit elements having waveform shaping or amplifying functions) NI1, NI2 and an invertor IV1 at the input stage of the first clock signal CLK. An AND gate AN1 which receives the clock signal CLK at one input outputs a clock signal with the delay time obtained in the delay circuit as pulse width. The output of the AND gate AN1 is passed through an AND gate AN2 and is made a read clock rck. The aforesaid read enable signal RE is supplied to the other input of the AND gate AN2 and when the signal RE which is set at an "H" level at the time the read operation is designated is set at an "L" level, the read clock rck is nullified and the read cycle is prohibited.

A write clock wck causes the output of the AND gate AN1 to delay from the read clock rck via an non-invertor NI3, a delay element DL and a non-invertor NI4. The output of the AND gate AN1 is thus generated through an AND gate AN3. The write enable signal WE is supplied to the other input of the AND gate AN3 and when the signal WE which is set at the "H" level at the time the write operation is designated is set at the "L" level, the write clock wck is nullified and the write cycle is prohibited.

The read and write clocks rck, wck are supplied to an OR gate OR1 and the second clock signal ck is output from the OR gate OR1. Therefore, the second clock signal ck has a multiplied frequency which is twice as high as that of the first clock signal CLK while both the read and write clocks rck, wck are valid, that is, when the read and write operations are designated in parallel according to the write and read enable signals WE, RE are designated. When either read or write is designated, on the other hand, the second clock signal ck becomes a clock signal substantially equal to the read clock rck or wck and its frequency also becomes equal to that of the first clock signal CLK.

The read clock rck and the write clock wck are input via invertors IV2, IV3 to a static clutch circuit having NAND gates NA1, NA2 where switch pulses are formed. The switch pulse sent out of an non-invertor NI5 is used for switching the read cycle of the RAM core 7 to the write cycle thereof as the read/write signal r/w. When at the "H" level, the read/write signal r/w designates the read operation, whereas at the "L" level, it designates the write operation.

The switch pulses sent out of the non-invertors NI5, NI6 are supplied to the AND gates AN4, AN5 of the parallel-serial address conversion circuit 40. The read address A(R)i and the write address A(W)i are respectively supplied to the other inputs of the AND gates AN4, AN5, causing the read address A(R)i and the write address A(W)i to be selected according to the switch pulses varies complementarily. The outputs of the AND gates AN4, AN5 are ORed at an OR gate OR2 and multiplexed before being supplied to the address input terminal ai of the RAM core 7.

An AND gate AN6 in the write data supply circuit 41 receives the switch pulse sent out of the non-invertor NI5. The write data Dinj is supplied to the other input terminal of the AND gate AN6, so that the write data Dinj is supplied to the data input terminal dinj of the RAM core 7 in synchronization with the "H" level of the read/write signal r/w.

The data stretching circuit 42 has a static clutch circuit having invertors IV4, IV5, and the invertor IV5 is formed with a transistor smaller than the invertor IV4. As the output impedance of the invertor IV5 is high, the latching of the read data doj of the RAM core 7 via an NMOS transistor Q1 forming a transfer gate is facilitated. The gate of Q1 is controlled by the read/write signal r/w. In other words, Q1 is turned on when r/w is at the "H" level and latches the state of the read data doj immediately before r/w is set at the "L" level, whereby the output signal Doj of the composite macro cell is obtained since the data sent out of the data output terminal doj of the RAM core 7 is stretched over the write cycle following the read cycle in terms of the output duration. Incidentally, the configurations of the parallel-serial address conversion circuit 40, the write data supply circuit 41 and the data stretching circuit 42 in FIG. 5 represent those equivalent to one bit by way of example.

Referring to a timing chart of FIG. 6, the operation of the logic circuit shown in FIG. 5 will subsequently be described. The operating timing of FIG. 6 is shown as what is made effective when the single port RAM core 7 is operated as a dual port RAM having special read/write ports in appearance.

In FIG. 6, the unit cycle period of the memory access operation in the circuit of the spread gate area 4 is set as what ranges from T0 to T2 (one period of the first clock signal CLK). The spread gate area 4 starts the memory read access cycle and the memory write access cycle in parallel during the period of T0~T2 in synchronization with the first clock signal CLK; that is, it activates the write enable signal WE and the read enable signal RE so that they are set at the "H" level, and outputs the read address A(R)i, the write address A(W)i and the write data Dinj. The multiplied clock generator circuit 43 generates the read clock rck which is set at the "H" level during a period equivalent to the delay time of the delay circuit formed with the non-invertors NI, NI2 and the invertor IV1 simultaneously with the write clock wck which is set at the "H" level with the delay time caused by the non-invertor NI3, the delay element DL and the non-invertor NI4. The OR between the read clock rck and the write clock wck is supplied to the RAM core 7 as the second clock signal ck. The one period of the clock signal ck is made the basic unit operating cycle period in the RAM core 7 and the designation of the read operation is given to the RAM core 7 according to the read/write signal r/w during the period of the initial cycle (time T0~T1), whereas the designation of the write operation is given thereto according to the read/write signal r/w during the period of the following cycle (time T1~T2).

The read address A(R)i is supplied to the address input terminal ai during the read cycle above and the write data Dinj is supplied to the data input terminal dinj beforehand. The Ram core 7 thus holds the write data in the data input buffer beforehand. In parallel with this operation, the RAM core 7 couples the data input-output terminal of the memory cell to the common data line 15 in accordance with the read address, supplies the read data to the sense amplifier 18 via the read/write control circuit 16 under the control of the read/write signal r/w and outputs the read data from the output terminal doj. The data read from the RAM core 7 is supplied from the stretching circuit 42 to the spread gate area 4 over the write cycle in which the read/write signal r/w is set at the "L" level. The circuit in the spread gate area 4 can thus take in the read data at the timing exceeding T1; in other words, it can take in the read data during the access cycle period in synchronization with the clock signal CLK.

When the designation of the write cycle is given to the RAM core 7 at T1, the write address A(W)i is supplied to the address input terminal ai in synchronization therewith and the RAM core 7 thus couples the data input-output terminal of the memory cell in accordance with the address involved to the common data line 15. Then the data input buffer 17 designated to conform to the write cycle according to the read/write signal r/w writes data to the memory cell thus selected by supplying the write data imported beforehand via the read/write control circuit 16 to the common data line 15.

With the circuit arrangement of FIG. 5, the rate conversion circuit area 8 and the RAM core 7 are allowed to accept only the read or write access during the unit cycle period of the memory access operation in the spread gate area 4. In other words, only the read clock rck is generated during the unit access cycle period of T0~T2 of FIG. 6 when the read and write enable signals RE, WE are respectively set at the "H" and "L" levels and further when the read address A(R)i is supplied. The clock signal ck is correspondingly varied only once in terms of the clock. The read/write signal r/w is maintained at the "H" level during that time and only the read access to the RAM core 7 is thus carried out. The read clock rck is not varied when the read and write enable signals RE, WE are respectively set at the "L" and "H" levels and further when the read address A(W)i is supplied (that is, the clock signal ck is not varied at T0), and the clock signal ck is formed in synchronization with the variation of the write clock wck at T1 of FIG. 6. The RAM core 7 performs the write operation during T1~T2 accordingly. Referring to FIG. 5, the individual write operation has to be designated as what conforms to the individual read access since the write data supply circuit 41 is so arranged as to supply the write data Dinj to the data input terminal dinj during the period in which the read/write signal r/w remains at the "H" level.

The effect of the present invention according to the embodiment referred to FIG. 5 includes the following:

(1) Through the rate conversion circuit area 8, the circuit in the spread gate area 4 is capable of making the single port RAM core 7 accessible as a dual port RAM having special read/write ports in appearance.

(2) In other words, the rate conversion circuit area 8 is capable of completely using up the RAM core 7 up to its marginal level when the Ram core 7 is employed as a macro cell capable of high-speed operation unless the peripheral logic area of the spread gate area 4 is unable to operate at high speed.

(3) Although the single port RAM core 7 is made accessible as only a dual port RAM having special read/write ports in appearance according to the present invention but not capable of parallel reading or parallel writing, the area occupied by the RAM chip is considerably reducible in comparison with a case where a dual port RAM core having completely independent two ports is employed as long as the form of utilizing the semiconductor integrated circuit in such a manner is satisfactory. Consequently, it is possible for the spread gate area 4 to acquire the same access rate likewise.

(4) Since the read operation is caused to precede serial read/write access to the RAM core 7, the high-speed operation of the system as a whole can be made feasible. In other words, the level of the data line for increasing the speed of the operation will never be fully swung with respect to the supply voltage when the data read operation is performed. When the memory cell is a static memory cell, for example, the complementary data line to which data is read should tend to vary on the side of the supply voltage of, for example, Vcc and the potential difference is amplified by the sense amplifier before being transmitted to the data output buffer. On the other hand, the complementary data line is driven by the supply voltage like Vcc or Vss (grounding voltage). Therefore, not a little time will be required to precharge the data line set at the Vss level by writing data to the supply voltage like Vcc if the read operation is carried out after the write operation is performed because the read operation cannot be started instantly.

While the invention made by the present inventors has been described in its preferred embodiments, it is to be understood that modifications will occur without departing from the spirit of the invention.

For example, the macro cell as the second circuit area is not limited to the RAM core but may be replaced with a circuit such as a register having an input-output port as a storage means or any other circuit. Further, the first circuit area is also not limited to the spread gate area to which the basic cells of a gate array are applied but may be a circuit area whose operating speed is lower than that of the second circuit area.

Although a description has been given of the invention made by the present inventors with reference to a case where RAM or the macro cell is utilized in the semiconductor integrated circuit as a communication time switch in the field of application as the background thereof, the present invention is not limited to that kind of utilization but may be applicable to any other semiconductor integrated circuit for communication control, single chip microcomputers and the like.

The effect of the present invention achievable from the preferred embodiment thereof is as follows:

(1) With the progress of circuit technology and the processing thereof, the operating speed of macro cells as second circuit areas appears to be further improvable and may surpass that of first circuit areas such as spread gate areas in ASICs. Therefore, the second circuit area such as a macro cell can be used up at a marginal high speed by causing a clock signal having a multiplied frequency with respect to an operating clock signal in the first circuit area to be generated in a semiconductor integrated circuit to allow the second circuit area to exchange data with the circuit formed in the first circuit area via a rate conversion circuit area.

(2) When the macro cell in the second circuit area is a RAM core, for example, the circuit in the spread gate area becomes accessible as a multiport RAM in appearance via the rate conversion circuit area.

(3) As mentioned above, the area occupied by the RAM chip is greatly reducible in comparison with the use of a dual-port RAM core actually having a multiport and this makes a similar access rate available for the spread gate area.

(4) The overall series read/write operating speed can practically be increased by preceding the read operation when series read/write access is gained to the RAM core.

What is claimed is:

1. A semiconductor integrated circuit comprising:
a first circuit area operating in synchronization with a first clock signal, a second circuit area capable of operating in synchronization with a clock signal whose frequency is higher than that of the first clock signal, and a rate conversion circuit area for use in the exchange of data between the first and second circuit areas, wherein the rate conversion circuit area further comprises a multiplied clock generator circuit for forming a second clock signal whose frequency is multiplied an optional number of times that of the first clock signal according to the first clock signal, and a parallel-serial conversion circuit for receiving data equivalent to a plurality of operating cycles in parallel from the first circuit area during a predetermined unit operating cycle period in the first circuit area so as to supply to the second circuit area the parallel data serially during the plurality of operating cycle periods in synchronization with the second clock signal.

2. A semiconductor integrated circuit according to claim 1, wherein the rate conversion circuit area is further provided with a serial-parallel conversion circuit for serially receiving data, which the second circuit area obtains during the plurality of operating cycle periods in synchronization with the second clock signal, from the second circuit area so as to supply to the first circuit area the serial data in parallel during the predetermined unit operating cycle period defined by the first clock signal.

3. A semiconductor integrated circuit according to claim 1, wherein the rate conversion circuit area is further provided with a stretching circuit for receiving data, which the second circuit area has obtained during the operating cycle period in synchronization with the second clock signal, so as to supply the data to the first circuit area over the operating cycle period in synchronization with the second clock signal.

4. A semiconductor integrated circuit according to claim 2, wherein the first circuit area is a spread gate area whose required function is practically attained on the basis of the form of connecting numerous basic circuits repetitively and wherein the second circuit area is a macro cell whose required function is practically attained by making the integration of circuit elements therein greater than that of those in the spread gate area.

5. A semiconductor integrated circuit according to claim 4, wherein when the macro cell is a RAM core which has a memory array and access ports for writing and reading data to and from the memory array and is coupled to the rate conversion circuit area, the RAM core makes the number of access ports in appearance as viewed from the first circuit area corresponds, through the rate conversion circuit, to the second clock signal whose frequency is multiplied an optional number of times that of the first clock signal.

6. A semiconductor integrated circuit comprising:
a first circuit area operating in synchronization with a first clock signal,
a second circuit area which is capable of operating in synchronization with a clock signal whose frequency is higher than that of the first clock signal and has a memory array and access ports for writing and reading data to and from the memory array,
a rate conversion circuit area for making the second circuit area accessible from the first circuit area, wherein the rate conversion circuit area further comprises a multiplied clock generator circuit for forming a second clock signal whose frequency is multiplied an optional number of times that of the first clock signal according to the first clock signal and supplying the second clock signal to the second circuit area, a parallel-serial conversion circuit for receiving a plurality of memory access data equivalent to a plurality of operating cycles in parallel from the first circuit area during a memory access unit operating cycle period in the first circuit area so as to supply to one of the access ports of the second circuit area the plurality of parallel data serially during the plurality of memory operating cycle periods in synchronization with the second clock signal.

7. A semiconductor integrated circuit according to claim 6, wherein the rate conversion circuit area is further provided with a stretching circuit for receiving data, which the second circuit area has read from the memory array during the memory operating cycle period in synchronization with the second clock signal, so as to supply the data to the first circuit area over the memory operating cycle period in synchronization with the second clock signal.

8. A semiconductor integrated circuit comprising:
a first circuit area operating in synchronization with a first clock signal,
a second circuit area which is capable of operating in synchronization with a clock signal whose frequency is higher than that of the first clock signal and has a memory array and access ports for writing and reading data simultaneously to and from the memory array, and
a rate conversion circuit area for making the second circuit area accessible from the first circuit area, wherein the first circuit area is a spread gate area whose required function is practically attained on the basis of the form of connecting numerous basic circuits repetitively and the second circuit area is a macro cell whose required function is practically attained by making the integration of circuit elements therein greater than that of those in the spread gate area, the rate conversion circuit area further comprises a multiplied clock generator circuit for receiving an access control signal for allowing the first circuit area to gain access to the second circuit area and the first clock signal from the first circuit area, and forming a second clock signal whose frequency is multiplied an optional number of times that of the first clock signal according to the first clock signal and read/write signals for sequentially designating a read operation in synchronization with the second clock signal and the following write operation so as to supply these signals to the second circuit area when the read and write operations are designated in parallel according to the access control signal, a parallel-serial conversion circuit for receiving memory access data for writing and reading in parallel from the first circuit area during a memory access unit operating cycle period in the first circuit area so as to supply to one of the access ports of the second circuit area the plurality of parallel data serially during the plurality of memory operating cycle periods in synchronization with the second clock signal, and a stretching circuit for receiving data, which the second circuit area has read from the memory array during a read operation cycle period in synchronization with the second clock signal, so as to supply the data to the first circuit area over the read operation cycle period in synchronization with the second clock signal.

* * * * *